(12) United States Patent
Kyono et al.

(10) Patent No.: US 7,939,354 B2
(45) Date of Patent: May 10, 2011

(54) METHOD OF FABRICATING NITRIDE SEMICONDUCTOR LASER

(75) Inventors: Takashi Kyono, Itami (JP); Katsushi Akita, Itami (JP); Yusuke Yoshizumi, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 151 days.

(21) Appl. No.: 12/396,858

(22) Filed: Mar. 3, 2009

(65) Prior Publication Data

US 2009/0227056 A1 Sep. 10, 2009

(30) Foreign Application Priority Data

Mar. 7, 2008 (JP) ................................. 2008-058305

(51) Int. Cl.
*H01L 21/00* (2006.01)
(52) U.S. Cl. ........... 438/46; 438/460; 257/189; 257/745
(58) Field of Classification Search .................. 257/189, 257/745; 438/46, 460
See application file for complete search history.

(56) References Cited

U.S. PATENT DOCUMENTS

| | | | |
|---|---|---|---|
| 6,355,497 B1 | 3/2002 | Romano et al. | |
| 6,596,079 B1 * | 7/2003 | Vaudo et al. | 117/97 |
| 6,876,009 B2 * | 4/2005 | Narukawa et al. | 257/183 |
| 7,323,719 B2 * | 1/2008 | Kawaguchi | 257/79 |
| 7,435,608 B2 * | 10/2008 | Shibata | 438/46 |
| 7,655,197 B2 * | 2/2010 | Vaudo et al. | 422/292 |
| 7,727,874 B2 * | 6/2010 | Hanser et al. | 438/604 |
| 2009/0122822 A1 * | 5/2009 | Murayama | 372/43.01 |

FOREIGN PATENT DOCUMENTS

| | | |
|---|---|---|
| JP | 11-340576 A | 12/1999 |
| JP | 2001-257193 A | 9/2001 |

(Continued)

OTHER PUBLICATIONS

Okamoto et al, "Pure Blue Laser Diodes Based on Nonpolar *m*-Plane Gallium Nitride with InGaN Waveguide Layers", Japanese Journal of Applied Physics, vol. 46, No. 35, pp. L820-L822 (2007).

*Primary Examiner* — Jarrett J Stark
*Assistant Examiner* — Nicholas Tobergte
(74) *Attorney, Agent, or Firm* — Venable LLP; Michael A. Sartori; Kyle D. Petaja

(57) ABSTRACT

A method of fabricating a nitride semiconductor laser comprises preparing a substrate having a plurality of marker structures and a crystalline mass made of a hexagonal gallium nitride semiconductor. The primary and back surfaces of the substrate intersect with a predetermined axis extending in the direction of a c-axis of the hexagonal gallium nitride semiconductor. Each marker structure extends along a reference plane defined by the c-axis and an m-axis of the hexagonal gallium nitride semiconductor. The method comprises cutting the substrate along a cutting plane to form a wafer of hexagonal gallium nitride semiconductor, and the cutting plane intersects with the plurality of the marker structures. The wafer has a plurality of first markers, each of which extends from the primary surface to the back surface of the wafer, and each of the first markers comprises part of each of the marker structures. The primary surface of the wafer is semipolar or nonpolar. The method comprises growing a number of gallium nitride based semiconductor layers for a semiconductor laser. The method comprises cleaving the substrate product at a cleavage plane of the hexagonal gallium nitride semiconductor, after forming a substrate product in an electrode forming step.

21 Claims, 11 Drawing Sheets

FOREIGN PATENT DOCUMENTS

| | | |
|---|---|---|
| JP | 2002-029897 A | 1/2002 |
| JP | 2003-183100 A | 7/2003 |
| JP | 2004-327655 A | 11/2004 |
| JP | 2004-327879 A | 11/2004 |
| JP | 2005-175056 A | 6/2005 |
| JP | 2006-193348 A | 7/2006 |
| JP | 2007-329418 A | 12/2007 |
| WO | WO-03/036771 A1 | 5/2003 |

* cited by examiner (A)

(B)

(A)

(B)

METHOD OF FABRICATING NITRIDE SEMICONDUCTOR LASER

FIELD OF THE INVENTION

The present invention relates to a method of fabricating a nitride semiconductor laser.

DESCRIPTION OF THE RELATED ART

Nonpatent Document 1 (Kuniyoshi OKAMOTO et. al, "Pure Blue Laser Diodes Based on Nonpolar m-plane Gallium Nitride with InGaN Waveguiding Layers", Japanese Journal of Applied Physics, Vol. 46, No. 35, 2007, p. L820-L822) discloses a blue laser diode. This laser diode is formed on a nonpolar m-plane gallium nitride substrate. The laser diode has an oscillation wavelength of 451.8 nm and a threshold current of 134 mA. The laser diode includes an InGaN quantum well structure, a p-type GaN or InGaN optical waveguide layer, an n-type GaN or InGaN optical waveguide layer, and an Al-containing cladding layer.

SUMMARY OF THE INVENTION

A light emitting device such as a semiconductor laser can be formed on a nonpolar GaN substrate or a semipolar GaN substrate. The nonpolar GaN substrate and the semipolar GaN substrate for the light-emitting device can be fabricated as follows for example.

A thick crystal of GaN is sliced into a small GaN semiconductor piece. The surface of this GaN semiconductor piece has a desired GaN crystal orientation. Then, a number of semiconductor layers for a semiconductor laser are grown on the GaN semiconductor piece to form a stack of semiconductor layers. After forming structures, such as electrodes for the semiconductor laser, on the stack of semiconductor layers and the semiconductor piece, the semiconductor piece is cleaved to form cleavage surfaces for a laser cavity. Since a laser stripe must be aligned with reference to the laser cavity, the surface orientation of the semiconductor piece should be measured by, for example, X-ray diffraction to determine the orientation of the edge of the semiconductor piece. For example, the laser stripe can be oriented with reference to the edge of the semiconductor piece. Since semiconductor pieces are fabricated as above, the orientation of the edges of the semiconductor pieces vary piece by piece. In addition, it is not easy to orient the laser stripe with reference to the edge, resulting in erroneous orientation of the laser stripe.

Although the aforementioned GaN semiconductor piece has a GaN crystal surface of a desired orientation, the orientation of the laser cavity is not taken into consideration in fabricating of a GaN semiconductor piece. Similarly, the orientation of the laser cavity is not taken into consideration in fabricating of a GaN thick film for forming semiconductor pieces.

It is an object of the present invention is to provide a method of fabricating a nitride semiconductor laser on a nonpolar or semipolar wafer, and this method can facilitate to orient the laser cavity for nitride semiconductor laser on the wafer.

An aspect of the present invention is a method of fabricating a nitride semiconductor laser. This method includes a step of preparing a substrate. The substrate has a crystalline mass, a primary surface and a back surface, and a plurality of marker structures. The crystalline mass comprises a hexagonal gallium nitride semiconductor. The primary surface and the back surface intersect a predetermined axis extending in the c-axis of the hexagonal gallium nitride semiconductor. The crystalline mass extends from the primary surface to the back surface of the substrate. Each of the marker structures extends along a reference plane from the primary surface to the back surface of the substrate. The reference plane is specified by one of the following planes: a plane defined by the m-axis and the c-axis of the hexagonal gallium nitride semiconductor; a plane defined by the a-axis and the c-axis of the hexagonal gallium nitride semiconductor. The method includes the step of cutting the substrate along a cutting plane to form a hexagonal gallium nitride semiconductor wafer, and the cutting plane intersects with the plurality of marker structures. The hexagonal gallium nitride semiconductor wafer has a primary surface and a back surface, and a plurality of first markers. Each of the first markers extends from the primary surface to the back surface of the hexagonal gallium nitride semiconductor wafer, and is made of part of each of the marker structures. The primary surface of the hexagonal gallium nitride semiconductor wafer is semipolar or nonpolar. The method includes the step of forming a stack of semiconductor layers. The stack of semiconductor layers includes second markers and a plurality of gallium nitride based semiconductor layers for a semiconductor laser. The second markers extend along a predetermined axis in the gallium nitride based semiconductor layers, and reside on the respective first markers. The plurality of gallium nitride based semiconductor layers are grown by epitaxial growth on the primary surface of the hexagonal gallium nitride semiconductor wafer. The method includes the step of forming an insulating film on the stack of semiconductor layers. The insulating film has openings extending along the direction of the second markers. The method includes the step of forming electrodes on the insulating film and the stack of semiconductor layers to form a substrate product, after the formation of the insulating film. The method includes the step of cleaving the substrate product at a cleavage plane of the hexagonal gallium nitride semiconductor, after formation of the electrodes.

According to the method, since the substrate includes the marker structures extending along the reference plane, the substrate is cut along the aforementioned cutting plane intersecting with each of the marker structures to fabricate the wafer including the first markers. The reference plane is defined by one of the following combinations: a combination of the m-axis and the c-axis; the a-axis and the c-axis of the hexagonal gallium nitride semiconductor, and thus the first markers can be used to orient the laser cavity of the semiconductor laser in an appropriate direction.

In the method according to the present invention, the reference plane for the marker structures is defined by the a-axis and the c-axis of the hexagonal gallium nitride semiconductor, and the cutting plane rotates a given angle about the predetermined axis with reference to an m-plane of the hexagonal gallium nitride semiconductor.

This method provides a nonpolar a-plane wafer or a wafer of the primary surface that is tilted with reference to the a-plane. On the primary surface, the first markers are directed to in the direction of the c-axis.

In the method according to the present invention, the primary surface of the hexagonal gallium nitride semiconductor wafer is tilted with reference to the m-plane of the hexagonal gallium nitride semiconductor. The distance between the adjacent first markers is larger than that of the adjacent marker structures, and the cleavage plane of the substrate product is a c-plane of the hexagonal gallium nitride semiconductor.

In this method, the c-plane cleavage provides cleavage surfaces for a laser cavity. Because of the above tilt, the distance between the adjacent first markers is larger than that of the adjacent marker structures.

In the method according to the present invention, the cutting plane extends along an a-plane of the hexagonal gallium nitride semiconductor. This method can fabricate a number of wafers each having a nonpolar a-plane surface.

In the method according to the present invention, the primary surface of the hexagonal gallium nitride semiconductor wafer has an a-plane of the hexagonal gallium nitride semiconductor, and the cleavage plane of the substrate product is a c-plane of the hexagonal gallium nitride semiconductor. In this method, the first marker extends in the direction of the c-axis. The first marker permits the fabrication of a laser structure to which a c-plane cleavage can be applied.

In the method according to the present invention, the reference plane for the marker structures is defined by the m-axis and the c-axis of the hexagonal gallium nitride semiconductor, and the cutting plane rotates a given angle about the predetermined axis with reference to an a-plane of the hexagonal gallium nitride semiconductor.

This method provides a nonpolar m-plane wafer or a wafer of the primary surface that is tilted with reference to the m-plane. On the primary surface, the first markers are directed to the direction of the c-axis.

In the method according to the present invention, the primary surface of the hexagonal gallium nitride semiconductor wafer is tilted with reference to the a-plane of the hexagonal gallium nitride semiconductor. The distance between the adjacent first markers is larger than that of the adjacent marker structures, and the cleavage plane of the substrate product is a c-plane of the hexagonal gallium nitride semiconductor.

In this method, the a-plane cleavage provides cleavage surfaces for a laser cavity. Because of the above tilt, the distance between the adjacent first markers is larger than that of the adjacent marker structures.

In the method according to the present invention, the cutting plane extends along an m-plane of the hexagonal gallium nitride semiconductor. This method can fabricate a number of wafers each having a nonpolar m-plane surface.

In the method according to the present invention, the primary surface of the hexagonal gallium nitride semiconductor wafer has an m-plane of the hexagonal gallium nitride semiconductor, and the cleavage plane of the substrate product is a c-plane of the hexagonal gallium nitride semiconductor. In this method, the first marker extends in the direction of the c-axis. The first marker permits the fabrication of a laser structure to which a c-plane cleavage can be applied.

In the method according to the present invention, the substrate has a curved side extending in the direction of the c-axis of the hexagonal gallium nitride semiconductor, and the cutting plane intersects with the primary surface, the back surface and the side surface of the substrate.

In this method, the thickness of the substrate is associated with one side of the wafer, whereas the diameter of the substrate is associated with the other side of the wafer.

In the method according to the present invention, the reference plane for the marker structures is defined by the a-axis and the c-axis of the hexagonal gallium nitride semiconductor, and the cutting plane is tilted by a finite angle to the m-axis of the hexagonal gallium nitride semiconductor with reference to the c-plane of the hexagonal gallium nitride semiconductor.

This method provides a semipolar wafer of the primary surface that is tilted with reference to the m-plane. On the primary surface, the first markers are directed to the direction of the a-axis.

In the method according to the present invention, the primary surface of the hexagonal gallium nitride semiconductor wafer includes a semipolar surface, and the semipolar surface is tilted with reference to a c-plane of the hexagonal gallium nitride semiconductor. The distance between the adjacent first markers is larger than that of the adjacent marker structures, and the cleavage plane of the substrate product is an a-plane of the hexagonal gallium nitride semiconductor.

In this method, the a-plane cleavage provides cleavage surfaces for a laser cavity. Because of the tilt of the semipolar surface, the distance between the adjacent first markers is larger than that of the adjacent marker structures.

In the method according to the present invention, the reference plane for the marker structures is defined by the m-axis and the c-axis of the hexagonal gallium nitride semiconductor. The cutting plane is tilted by a finite angle to the a-axis of the hexagonal gallium nitride semiconductor with reference to a c-plane of the hexagonal gallium nitride semiconductor.

This method provides a semipolar wafer of the primary surface that is tilted with reference to the a-plane. On the primary surface, the first markers are directed to the direction of the m-axis.

In the method according to the present invention, the primary surface of the hexagonal gallium nitride semiconductor wafer includes a semipolar surface, and the semipolar surface is tilted with reference to the c-plane of the hexagonal gallium nitride semiconductor. The distance between the adjacent first markers is larger than that of the adjacent marker structures, and the cleavage plane of the substrate product is an m-plane of the hexagonal gallium nitride semiconductor.

In this method, the m-plane cleavage provides cleavage surfaces for a laser cavity. Because of the tilt of the semipolar surface, the distance between the adjacent first markers is larger than that of the adjacent marker structures.

In the method according to the present invention, the substrate has a curved side surface extending in the direction of the c-axis of the hexagonal gallium nitride semiconductor, and the cutting plane intersects with the side surface of the substrate. This method enables to produce a wafer with a very large diameter. In The method according to the present invention, the cutting plane intersects the side surface and the primary surface of the substrate, but does not intersect with the back surface of the substrate. Alternatively, in The method according to the present invention, the cutting plane intersects with the side surface and the back surface of the substrate, but does not intersect with the primary surface of the substrate. According to the method, although the size of this wafer is smaller than that of the above-mentioned wafer, the substrate can be used effectively for fabricating wafers.

The angle of inclination ranges from 15 degrees to 70 degrees. The method enables to fabricate a wafer having a semipolar primary surface.

In the method according to the present invention, the marker structures comprise a hexagonal gallium nitride semiconductor, and the substrate includes first regions and second regions, and the first regions and second regions are arranged alternately. The direction of the crystal axis of the first regions is opposite to that of the second region. The marker structures can include the first region. According to the method, the opposite orientation of the crystal axes of the first regions and second regions is utilized for the markers.

In The method according to the present invention, the substrate includes the first regions and the second regions, and the first regions and the second regions are arranged alternately. The first regions have a first average threading dislocation density that is greater than a predetermined threading dislocation density, while the second regions have a second average threading dislocation density that is smaller than the predetermined threading dislocation density, and the first regions and the second regions extend from the primary surface to the back surface of the substrate. Each of the marker structures can include one of the first regions.

According to the method, the first region having a high defect density, which is not used for a device, can be utilized for the markers, and a device can be fabricated on the second regions having a low defect density.

In the method according to the present invention, the substrate has grooves, each of which is defined by at least one side surface extending from the primary surface to the back surface of the substrate. The marker structures can include the grooves.

According to the method, the shape of the side of the substrate can be utilized as the markers.

In The method according to the present invention, the side surface of the substrate has grooves, and the grooves extend from the primary surface to the back surface of the substrate. Each marker structure includes a member comprising a material different from the hexagonal gallium nitride semiconductor. The member is provided in each groove and extends from the primary surface to the back surface of the substrate. The member comprises one of a polycrystalline substance, metallic material and insulating material, and the polycrystalline substance is different from hexagonal gallium nitride single crystal.

According to the method, the polycrystalline material, which fills the grooves on the side surface of the substrate, can be utilized as the markers.

BRIEF DESCRIPTION OF THE DRAWINGS

The above-described object and other objects, features, and advantages of the present invention will become apparent more easily in the detailed description of the preferred embodiments of the present invention which will be described below with reference to the accompanying drawings.

DESCRIPTION OF THE PREFERRED EMBODIMENTS

The teachings of the present invention will readily be understood in view of the following detailed description with reference to the accompanying drawings illustrated by way of example. Embodiments of the method of fabricating a nitride semiconductor laser according to the present invention will be described with reference to the accompanying drawings. When possible, parts identical to each other will be referred to with reference symbols identical to each other.

First Embodiment

Figure 1:
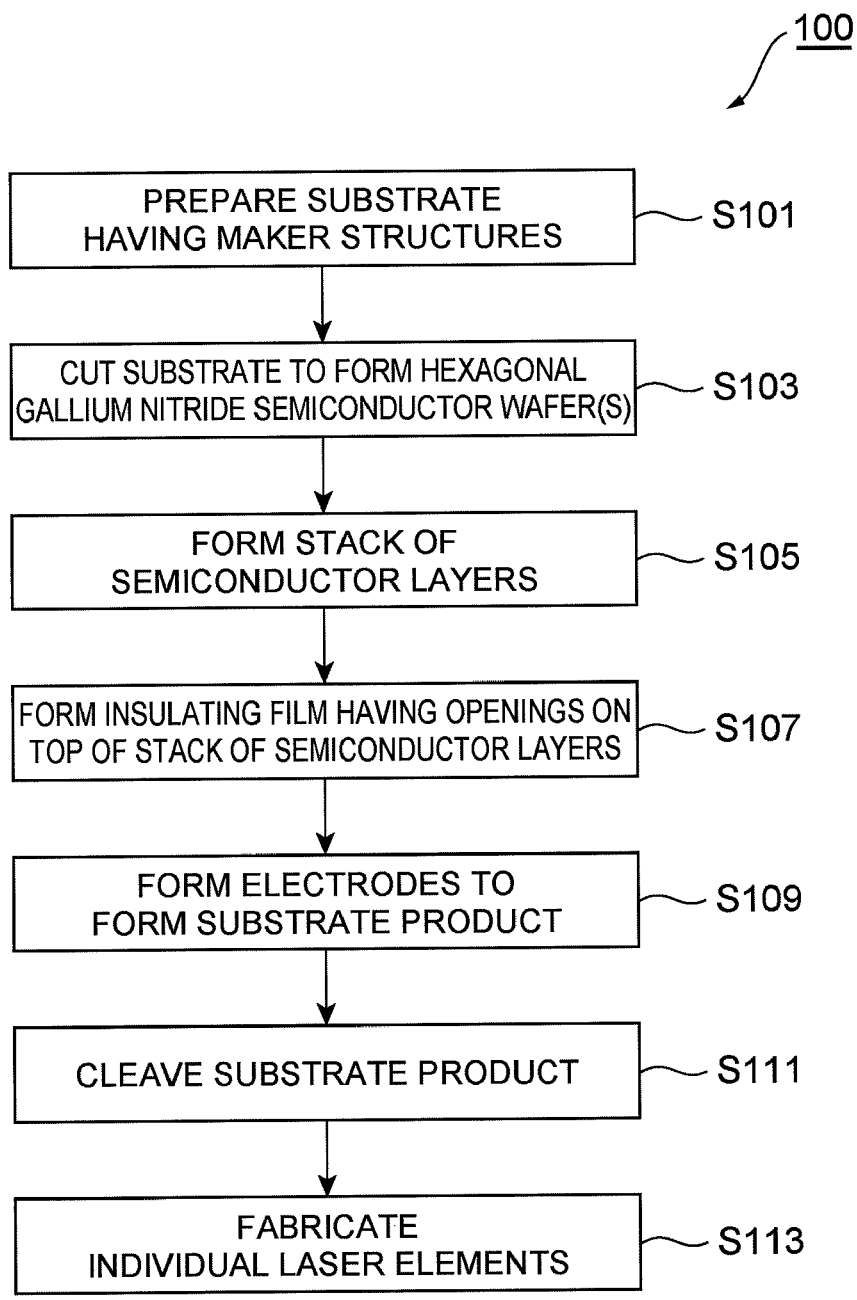
FIG. 1 is a flowchart illustrating primary steps of a method of fabricating a nitride semiconductor laser according to a first embodiment of the present invention.

FIG. 1 is a flowchart showing primary steps of a method of fabricating a nitride semiconductor laser according to a first embodiment of the present invention. With reference to a flowchart 100 in the drawing, the method of fabricating a nitride semiconductor laser of this embodiment includes Step S101 to prepare a substrate having a plurality of marker structures, Step S103 to cut the substrate into a hexagonal gallium nitride semiconductor wafer, Step S105 to form a stack of semiconductor layers on the wafer, Step S107 to form an insulating film with openings on the stack of semiconductor layers, Step S109 to form electrodes to complete a substrate product, Step S111 to cleave the substrate product to form a laser bar, and Step S113 to divide the laser bar into separated laser devices by cutting. Each of these steps will be described in detail below.

Step S101

Figure 2:
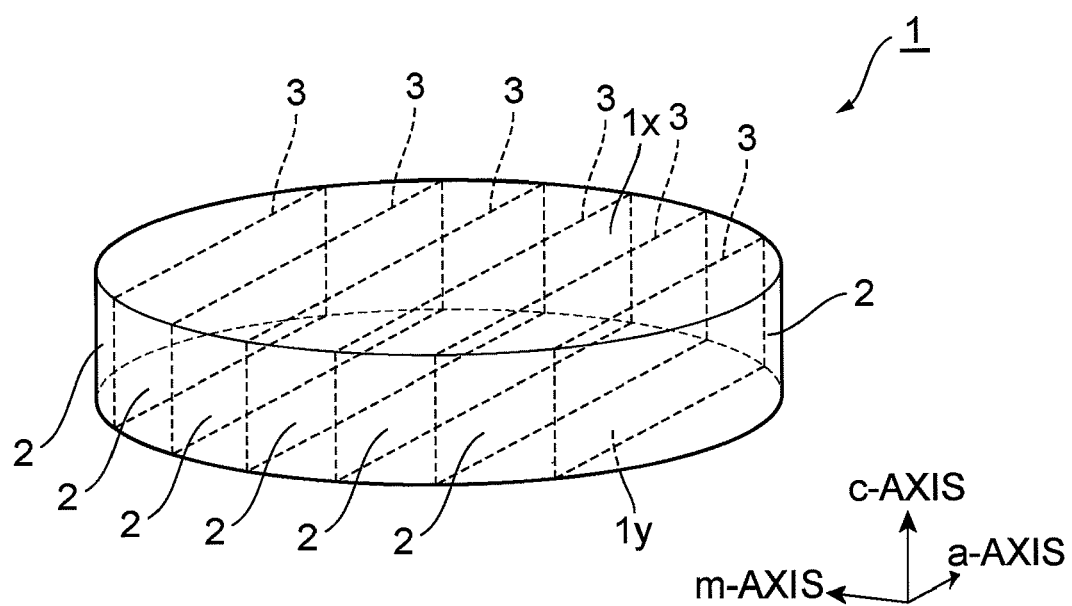
FIG. 2 is a schematic view illustrating a substrate of the first embodiment.

In Step S101, a substrate is prepared, and the substrate comprises a plurality of marker structures and a plurality of crystalline masses. FIG. 2 is a schematic view of a substrate of the present embodiment. A substrate 1 includes a plurality of crystalline masses 2 and a plurality of marker structures 3, and each of the plurality of crystalline masses 2 is made of a hexagonal gallium nitride semiconductor, which is grown by epitaxial growth. This hexagonal gallium nitride semiconductor may be, for example, gallium nitride (GaN). The substrate 1 has a primary surface 1x and a back surface 1y. The primary surface 1x and the back surfaces 1y intersect with an axis extending in the direction of the c-axis of the crystalline masses 2, and those surfaces 1x, 1y and the axis preferably intersect with each other at right angles. Each of the marker structures 3 extends along a reference plane defined by the a-axis and the c-axis of the crystalline masses 2, and this reference plane is hereinafter referred to as "the a-c reference plane." The marker structures 3 extend from the primary surface 1x to the back surface 1y of the substrate 1.

The crystalline masses 2 extend along the marker structures 3 from the primary surface 1x to the back surface 1y. The marker structures 3 and the crystalline masses 2 are arranged alternately in the direction of the m-axis of the crystalline masses 2. The marker structures 3 are made of GaN, and this region of GaN has a first average threading dislocation density that is greater than a predetermined threading dislocation density, whereas each crystalline mass 2 has a second average threading dislocation density that is smaller than the predetermined threading dislocation density. The direction of the c-axis of GaN of the marker structures 3 is opposite to that of the c-axis of GaN of the crystalline masses 2. The predetermined threading dislocation density ranges, for example, from $1\times10^6$ to $1\times10^8$ cm$^{-2}$.

On the regions of the marker structures 3 in the substrate 1, crystal defects are concentrated. The substrate 1 having the marker structures 3 can be formed, for example, as follows: An insulating film mask having a striped pattern is formed on a substrate base. The crystalline masses 2 are epitaxially grown on the substrate base and the insulating film mask, and marker structures are formed on the insulating film mask. The maximum distance between two edges on the primary surface $1x$ of the substrate 1 can be, for example, larger than 45 millimeters. For example, when the primary surface of the substrate base can be substantially circle, this distance corresponds to the diameter of the circle. For example, the side of the substrate 1 is curved, and the shape of the substrate 1 can be a circular cylinder.

Step S103

In Step S103, the substrate is sliced into a hexagonal gallium nitride semiconductor wafer. Part (A) of FIG. 3 is a schematic view showing the substrate and the hexagonal gallium nitride semiconductor wafer that is formed from the substrate by cutting, while Part (B) of FIG. 3 is a plan view showing the hexagonal gallium nitride semiconductor wafer that has been cut out from the substrate.

Figure 3:
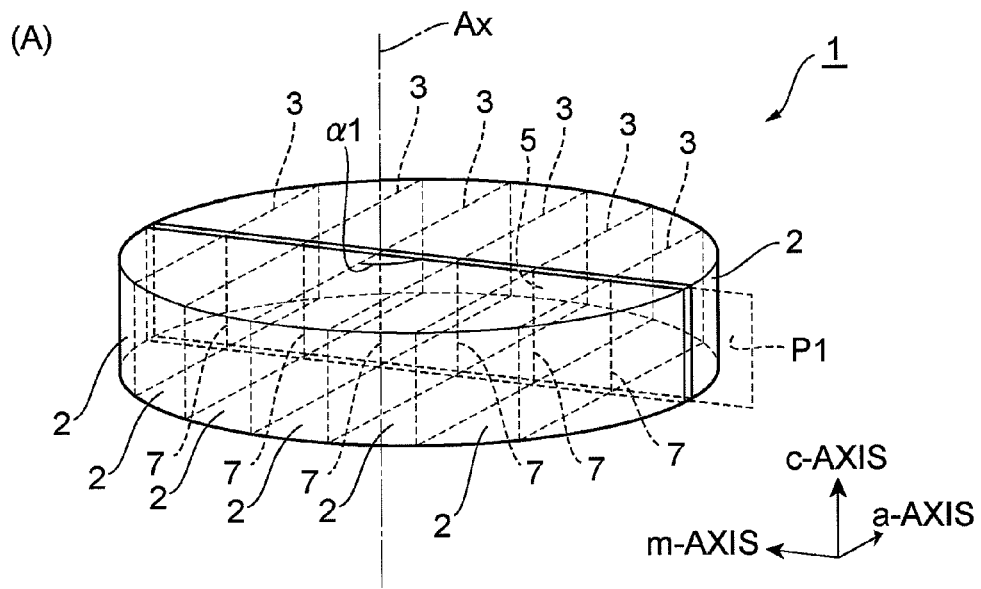
FIG. 3 is a schematic view illustrating a hexagonal gallium nitride semiconductor wafer which is formed by slicing a substrate.
Figure 3:
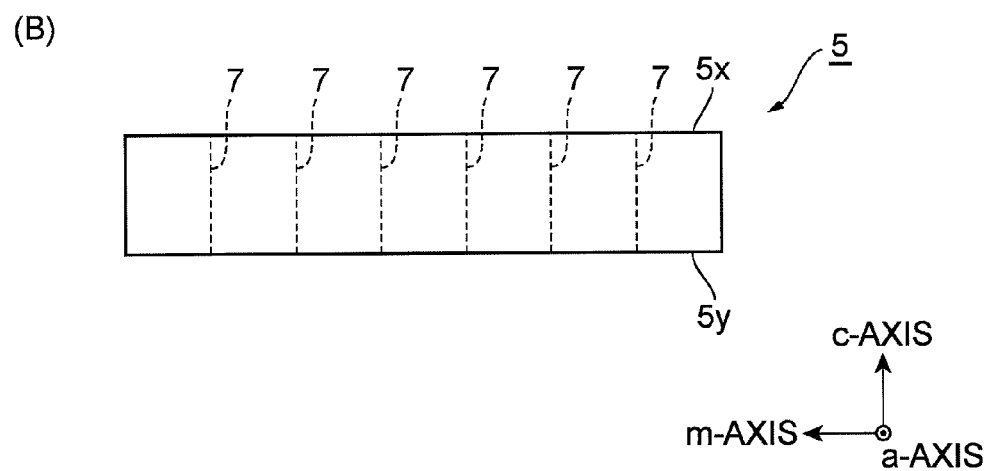

As shown in Part (A) of FIG. 3, in this step, the substrate 1 is cut into a GaN wafer 5. The substrate 1 is cut by use of a cutting device along a cutting plane P1 intersecting with the plurality of marker structures 3. For example, a wire saw can be used as a cutting device. In a first example, the cutting plane P1 can extend along an a-plane of the hexagonal gallium nitride semiconductor. The primary surface $5x$ of the GaN wafer 5 is a nonpolar surface. Piezoelectric polarization of semiconductor layers formed on the primary surface $5x$ of the GaN wafer 5 is small. In a second example, the cutting plane P1 can be inclined with reference to an m-plane of the hexagonal gallium nitride semiconductor at a rotation angle $\alpha 1$ about the predetermined axis Ax1 which extends in the direction of the c-axis. In the growth of the semiconductor layers on the primary surface $5x$ of the GaN wafer 5, the semiconductor layer can have an excellent surface morphology through control of the step density. In the above examples, the cutting plane P1 is tilted with reference to the m-plane at a finite rotation angle $\alpha 1$. The rotation angle $\alpha 1$ may be an acute angle, and alternately, the rotation angle $\alpha 1$ may be an obtuse angle.

Part (B) of FIG. 3 shows a GaN wafer 5 that has been sliced. Since the GaN wafer 5 is cut out from the substrate 1 along the a-plane, the primary surface $5x$ and the back surface $5y$ have the a-planes of the GaN wafer 5. Thus, the primary surface $5x$ of the GaN wafer 5 is a nonpolar surface.

Further, the marker structures 3 of the substrate 1 extend along the a-c reference plane from the primary surface $1x$ to the back surface $1y$ of the substrate 1, and when the substrate 1 is cut along the a-plane into the GaN wafer 5, the a-plane intersects with the marker structures 3. Thus, the GaN wafer 5 has a plurality of first markers 7 each extending along the c-axis of the crystalline masses 2, and the first markers 7 are associated with parts of the marker structures 3, respectively. Each of the first markers 7 extends along the a-c reference plane from the primary surface $5x$ to the back surface $5y$ of the GaN wafer 5 in the same manner as the marker structures 3.

Step S105

Figure 4:
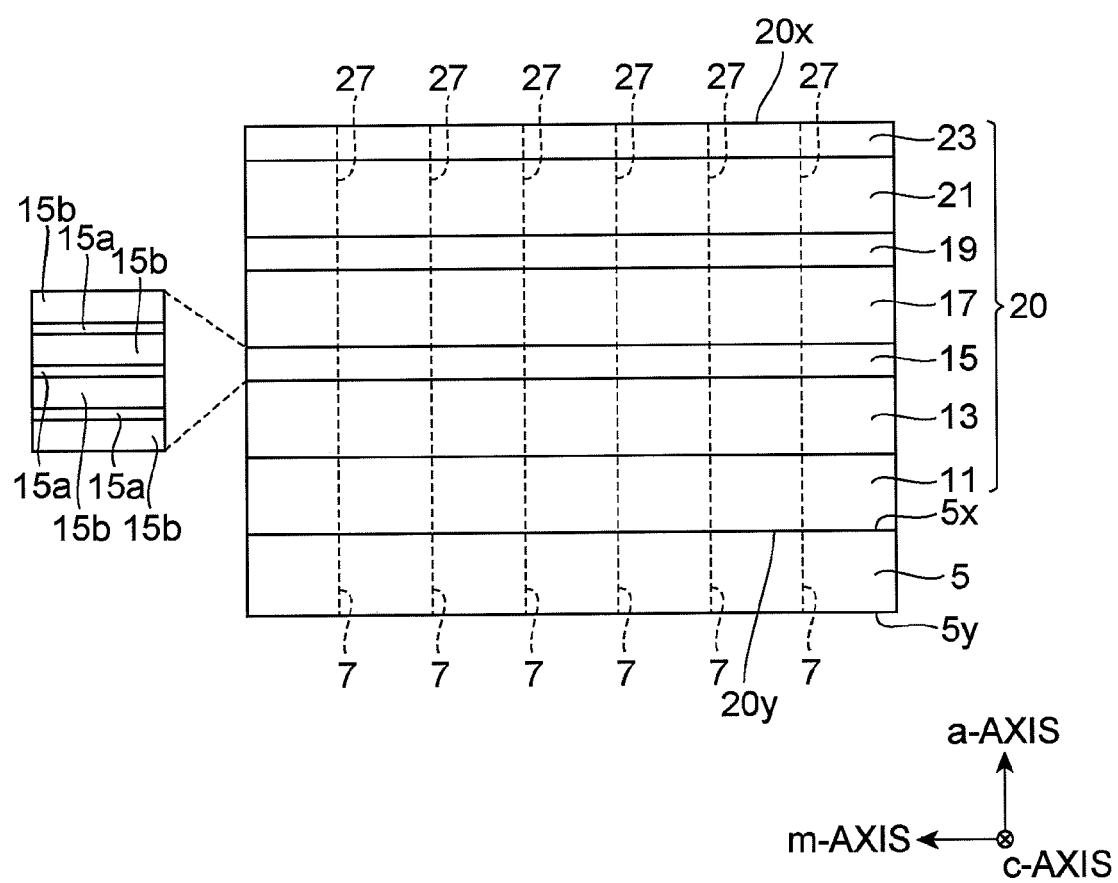
FIG. 4 is a cross sectional schematic view illustrating a stack of semiconductor layers formed on a GaN wafer.

In Step S105, a number of semiconductor layers for a semiconductor leaser is formed on the GaN wafer 5 to form a semiconductor stack on the GaN wafer. FIG. 4 is a schematic cross sectional view showing the stack of semiconductor layers.

The stack of semiconductor layers 20 is epitaxially grown on the primary surface $5x$ of the GaN wafer 5 by a method such as metal-organic chemical vapor deposition (MOCVD) or molecular beam epitaxy (MBE). The stack of semiconductor layers 20 may include a plurality of gallium nitride semiconductor layers for a semiconductor laser.

The stack of semiconductor layers 20 may include, for example, a lower cladding layer 11, a lower guide layer 13, an active layer 15, an upper guide layer 17, an electron block layer 19, an upper cladding layer 21, and a contact layer 23. These semiconductor layers are sequentially grown on the primary surface $5x$ of the GaN wafer 5. The active layer 15 has, for example, a quantum well structure, and the quantum well structure includes well layers and barrier layers, which are arranged alternately.

Lower cladding layer 11: n-type $Al_{0.04}Ga_{0.96}N$, 2 μm thick,
Lower guide layer 13: undoped $In_{0.02}Ga_{0.98}N$, 100 nm thick,
Active layer 15: three well layers $15a$ and four barrier layers $15b$,
Well layer $15a$: $In_{0.07}Ga_{0.93}N$, 3 nm thick,
Barrier layer $15b$: $In_{0.02}Ga_{0.98}N$, 15 nm thick,
Upper guide layer 17: undoped $In_{0.02}Ga_{0.98}N$, 100 nm thick,
Electron block layer 19: p-type $Al_{0.18}Ga_{0.82}N$, 20 nm thick,
Upper cladding layer 21: p-type $Al_{0.06}Ga_{0.94}N$, 400 nm thick, and
Contact layer 23: p-type GaN, 50 nm thick.

In deposition of the stack of semiconductor layers 20, this semiconductor stack is inherited from that of the crystal quality of the first markers 7 in the GaN wafer 5, and a plurality of first regions are deposited on the first markers 7, respectively. The first regions have a dislocation density that is greater than a predetermined threading dislocation density. The first regions are included in the semiconductor layers 20, and each of these first regions is referred to as a second marker 27. In other words, the second markers 27 are formed in the deposition of the stack of semiconductor layers 20 to form the first regions in the semiconductor layers 20. Since the second markers 27 are formed by epitaxial growth of the semiconductor layers 20, the second markers extend in the same direction as that of the first markers 7 from a lower surface $20y$ to an upper surface $20x$. Like the first markers 7, the second markers 27 extend along the a-c reference plane. The stack of semiconductor layers 20 includes the second regions that are different from the first regions; hence, the second regions are differentiated from the second markers 27 in the stack of semiconductor layers 20. The first regions and the second regions are arranged alternately in the direction of the m-axis in the semiconductor layers 20. The second regions have a dislocation density that is smaller than a predetermined threading dislocation density.

Step S107

Figure 5:
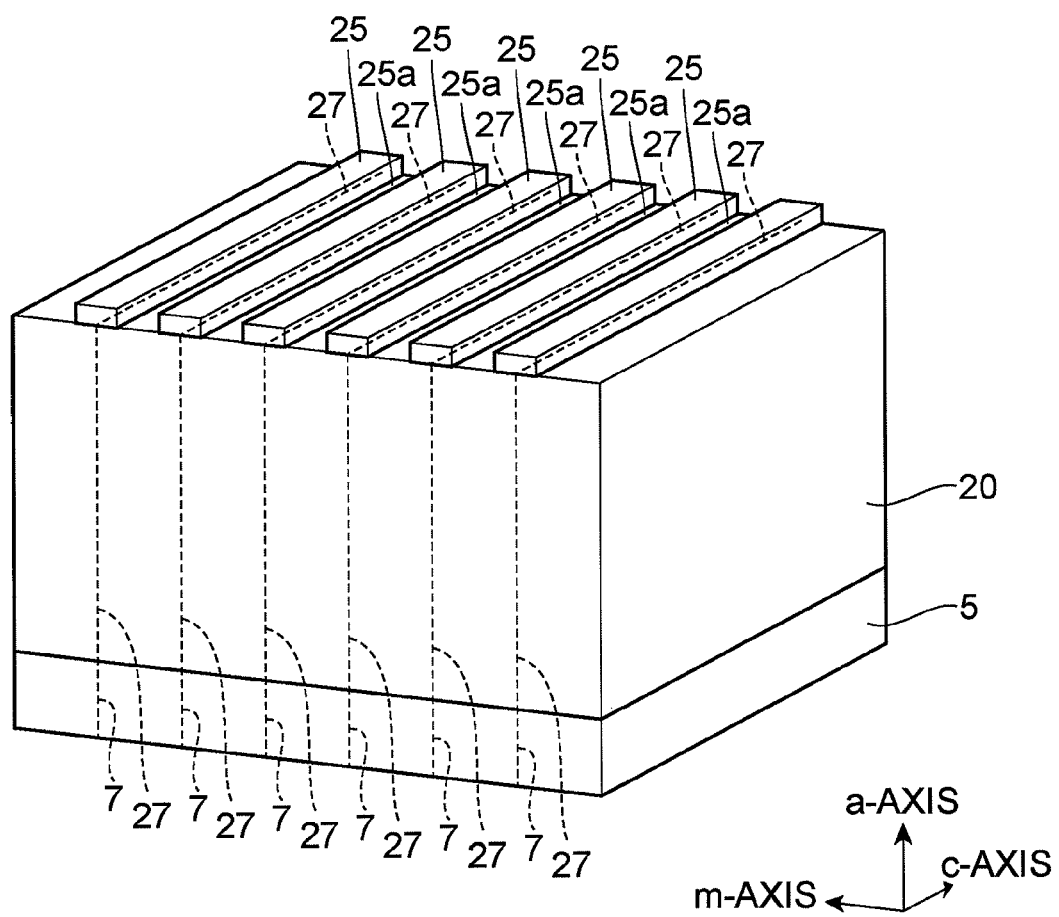
FIG. 5 is a perspective view illustrating a stack of semiconductor layers and an insulating film formed thereon.

In Step S107, an insulating film is formed, and the insulating film has openings located on the top of semiconductor layers 20. FIG. 5 shows the insulating film formed on the stack of semiconductor layers.

As shown in FIG. 5, an insulating layer 25 is formed on the stack of semiconductor layers 20. The insulating layer 25 has openings $25a$, which are aligned with the direction of the second markers 27. The openings $25a$ extend in the direction of the c-axis, which extends in the direction of the second markers 27.

The insulating layer 25 is formed, for example, as follows: An insulating film, such as $SiO_2$, is grown over the entire surface of the semiconductor layers 20 by a deposition technique, such as vacuum evaporation. The thickness of the insulating film is, for example, 100 nanometers. A mask is formed on the insulating film, and this mask is made of, for example, resist. The mask has a pattern to form the openings $25a$, and each opening $25a$ extends in the direction of, for example, the c-axis. Thereafter, the insulating film is etched by use of the mask to form the insulating layer 25, whereby a part of the top of the stack of semiconductor layers is exposed through the openings 25a. After this etching, the resist mask is removed.

Step S109

In Step S109, a lower electrode is formed on the back surface of the GaN wafer, and then an upper electrode is formed on the insulating layer and the top of the stack of semiconductor layers to complete a substrate product.

Figure 6:
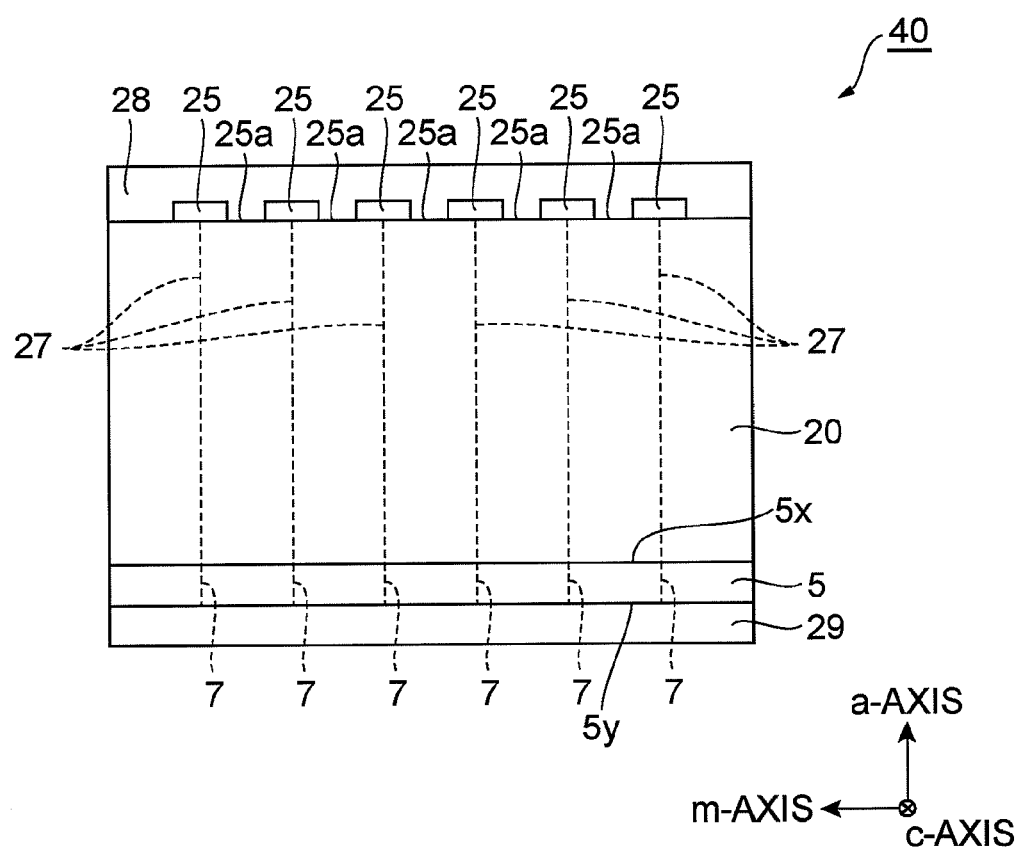
FIG. 6 is a schematic cross-section illustrating a substrate product.

FIG. 6 is a schematic cross sectional view showing a structure of the substrate product. As shown in FIG. 6, an upper electrode film 28 is formed on the insulating layer 25 and the stack of semiconductor layers 20. The insulating layer 25 has the openings 25a, each of which is oriented in the direction of the c-axis. The upper electrode film 28 is in contact with the stack of semiconductor layers 20 through the openings 25a. The upper electrode film 28 is patterned into upper electrodes for individual optical semiconductor devices. These upper electrodes also extend in the direction of the c-axis.

The upper electrode film 28 is patterned to form the upper electrodes, for example, anodes, which are in contact with the stack of semiconductor layers 20 through the openings 25a. The anodes are made of, for example, Ni/Au, which is formed by a deposition technique such as vacuum evaporation. Pad electrodes are formed on the upper electrodes, respectively. The pad electrodes are made of, for example, Ti/Au, which is formed by a deposition technique such as vacuum evaporation. The back surface of the GaN wafer 5 is ground, if required, and after the back-grinding, the thickness of the GaN wafer 5 is about 100 µm. A lower electrode 29 is formed on the ground back surface 5y of the GaN wafer 5. The lower electrode 29 can be formed, for example, over the entire ground back surface 5y. This lower electrode 29 may be, for example, a cathode, which is made of, for example, a laminate of a Ti/Al electrode and a Ti/Au layer. The Ti/Au electrode is formed by a deposition technique, such as vacuum evaporation. Through these steps, a substrate product 40 is formed.

Step S111

Figure 7:
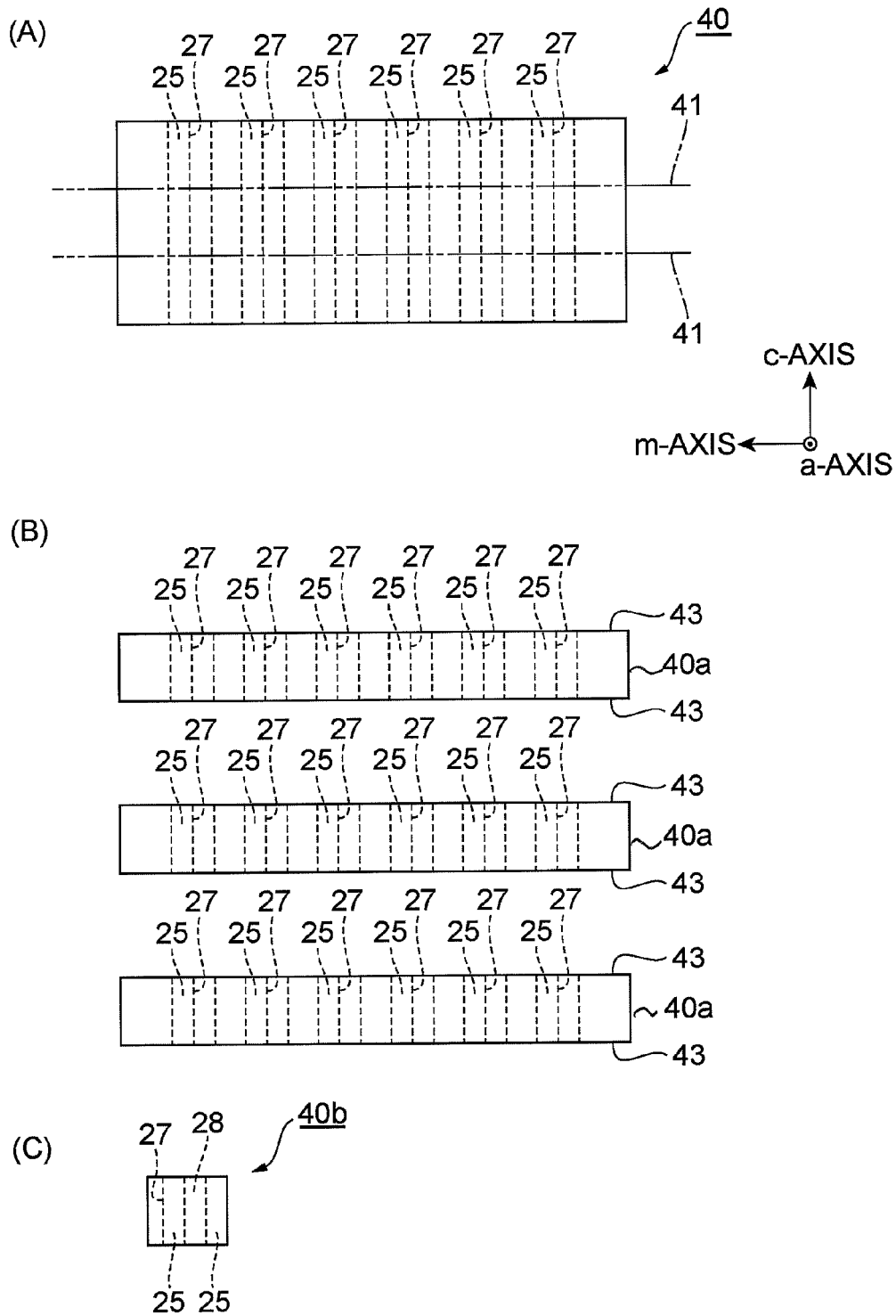
FIG. 7 is a schematic top view of a substrate product, a laser bar, and a laser device.

In Step S111, the cleavage of the substrate product 40 is carried out. Part (A) of FIG. 7 is a schematic view of the top surface of the substrate product 40. In this embodiment, the substrate product 40 is cleaved along lines 41, each of which extends along the c-plane of the GaN wafer, to form a number of laser bars 40a. Part (B) of FIG. 7 is a schematic view showing the laser bars having the cleaved faces of c-plane. In cleaving the substrate product 40, scribing lines are formed in accordance with the lines 41 on the surface of the substrate product 40 using a scriber device, and then the substrate product is pressed on the substrate product 40 at one of these scribing lines to form a laser bar having cleaved surfaces. These cleaved surfaces work as mirrors 43 that constitute a laser cavity of a nitride semiconductor laser. An optical coating layer may be formed on each of the mirror 43, and the coating is used to adjust the reflectivity thereof.

Step S113

In Step S113, the laser bar is cut to form individual laser devices. In particular, as shown in Part (C) of FIG. 7, the laser bar 40a is cut along the m-plane to form a number of nitride semiconductor laser devices, each of which is hereinafter referred to as a nitride semiconductor laser device 40b. As shown in Part (C) of FIG. 7, the nitride semiconductor laser device 40b in this embodiment has the second marker 27. Alternatively, the laser bar 40a may be divided to form a number of nitride semiconductor laser devices, which does not include the second marker 27.

As shown in FIGS. 2 and 3, since the substrate 1 includes the marker structures 3 extending along the a-c reference plane, the substrate 1 is sliced along a reference plane that extends along the a-plane, which intersects with each of the marker structures 3, to form a wafer including the first markers 7. Further, as shown in FIGS. 4 to 6, the second markers 27 in the stack of semiconductor layers 20 extend in the direction of the first markers 7. As compared with the alignment to the edge of a GaN piece, the orientation of the laser cavity can be easily obtained by use of the alignment with reference to the second markers 27 in the following steps: the formation of the openings of the insulating layer 25, the patterning for the upper electrode film 28, and/or the formation of the mirrors 43. In the GaN wafer 5 having an edge that is not parallel to the m-axis or the c-axis within a desired accuracy, the formation of the insulating layer 25 by alignment to the edge of the GaN piece does not provide the accurate orientation of the laser cavity. On the contrary, in the method of fabricating a nitride semiconductor laser according to the present embodiment, the laser cavity can be oriented accurately because the formation of the insulating layer 25 having the openings, the patterning of the upper electrode film 28, and/or the formation of the mirrors 43 are carried out by use of alignment with the second markers 27 oriented with reference to the crystal orientation of the GaN wafer 5.

Second Embodiment

Next, a method of fabricating a nitride semiconductor laser according to a second embodiment of the present invention will be described. In this embodiment, crystal orientation of a GaN wafer and crystalline masses having marker structures is different from that of the crystalline masses and the GaN wafer in the first embodiment.

Figure 8:
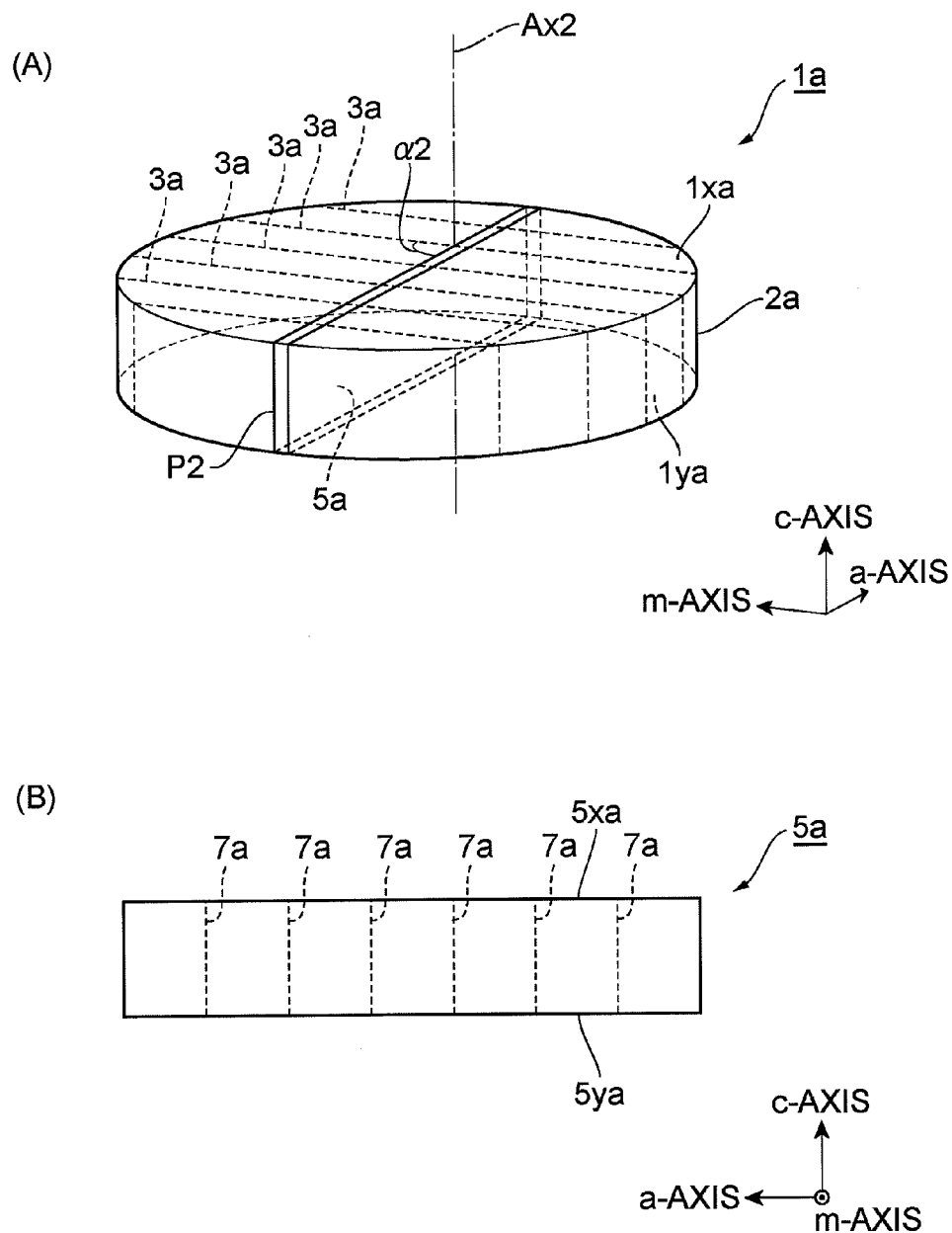
FIG. 8 is a schematic view illustrating a substrate and a GaN wafer according to a second embodiment of the present invention.

Part (A) of FIG. 8 is a schematic view showing a substrate 1a of the present embodiment. In this embodiment, the structure of the substrate 1a is different from that of the substrate in the first embodiment in the following point: the marker structures 3a of the substrate 1a extend along a reference plane defined by the m-axis and c-axis of a GaN crystal 2a, and the reference plane is hereinafter referred to as "the m-c reference plane."

In this embodiment, formation of the wafer is also different from that of the wafer in the first embodiment, and is described below. When the substrate 1a is cut along a cutting plane P2 intersecting with the marker structures 3a, the GaN wafer 5a is cut out from the substrate 1a. In a first example, the cutting plane P2 extends along an m-plane of the hexagonal gallium nitride semiconductor. The primary surface 5xa of the GaN wafer 5a is a nonpolar surface. Piezoelectric polarization of semiconductor layers formed on the nonpolar surface is small. In a second example, the cutting plane P2 may be rotated about the predetermined axis Ax2, which extends in the direction of the c-axis, and is inclined at a tilt angle α2 with reference to the m-plane. The tilt angle α2 may be an acute angle. Alternately, the tilt angle α2 may be an obtuse angle. In the growth of the semiconductor layers on the primary surface 5xa of the GaN wafer 5a, the semiconductor layer can have an excellent surface morphology because of control of the step density. In these examples, the plane P2 is tilted to the a-plane by a finite rotation angle α2.

Part (B) of FIG. 8 is a plan view showing the GaN wafer 5a. The GaN wafer 5a has a plurality of first markers 7a, each of which extends along the m-c reference plane, in the same manner as the marker structures 3a. The orientation of the first markers 7a in the GaN wafer 5a is different from that in the first embodiment.

In this embodiment, like the first embodiment, semiconductor layers are formed on the GaN wafer 5a to form the stack of semiconductor layers. Second markers are also formed in the stack of semiconductor layers, and extend in the direction of the c-axis. An insulating layer having openings is formed on the semiconductor layers. The openings of the insulating film are striped, each of which extends in the same direction as that of the second markers, or the direction of the c-axis. Electrodes are formed on the insulating film and the stack of semiconductor layers to complete a substrate product. This substrate product is cleaved into a number of laser bars. The laser bars are formed by cleavage of the substrate product along the c-plane of the GaN crystal 2a, and each laser bar has cleavage surfaces of c-plane. This laser bar includes the arrangement of semiconductor laser devices, and the laser bars are divided into individual nitride semiconductor laser devices.

In this embodiment, like the first embodiment, since the insulating layer, the upper electrode, and/or the mirrors are formed by use of the alignment with reference to the second markers, a laser cavity can be oriented easily, as compared with the method of forming a laser cavity by alignment to the edge of a GaN piece.

Third Embodiment

Next, a method of fabricating a nitride semiconductor laser according to a third embodiment of the present invention will be described below. In this embodiment, crystal orientation of a GaN wafer is different from that in the first embodiment.

Figure 9:
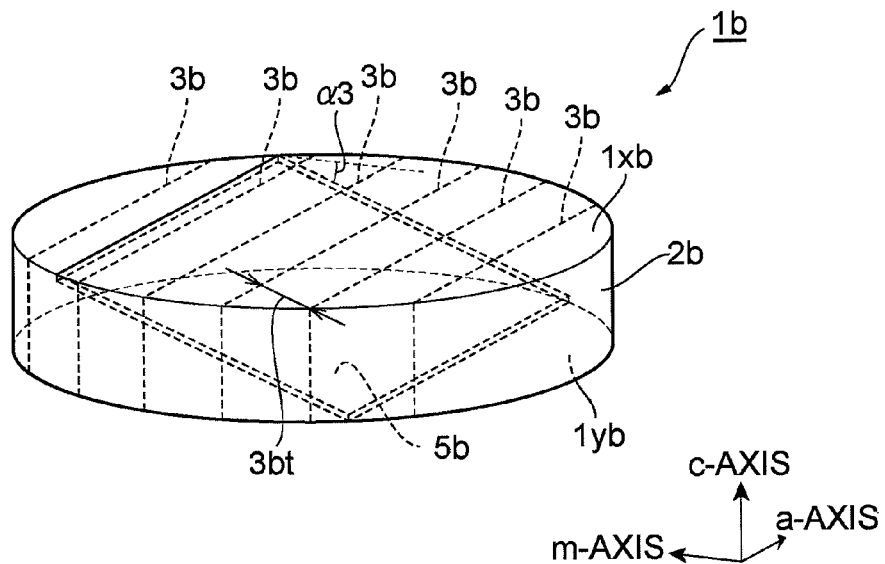
FIG. 9 is a schematic view illustrating a substrate and a GaN wafer produced therefrom by cutting according to a third embodiment of the present invention.
Figure 9:
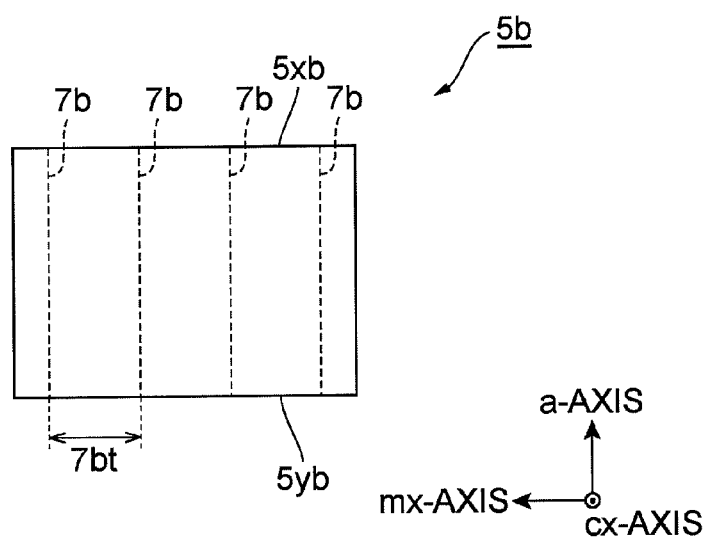

Part (A) of FIG. 9 is a schematic view showing a substrate 1b of this embodiment. In this embodiment, marker structures 3b are included in the substrate 1b, and each of the marker structures 3b extends along the a-c reference plane of a GaN crystal 2b.

In this embodiment, the substrate 1b is cut into a GaN wafer 5b along a cutting plane that is tilted with reference to the c-plane in the direction of the m-axis of the GaN crystal 2b by a desired off-angle α3. This cutting plane intersects with the marker structures 3b.

Part (B) of FIG. 9 is a plan view showing the GaN wafer 5b, which is formed by slicing from the substrate 1b. In this embodiment, the primary surface of the GaN wafer 5b is semipolar. FIG. 9 shows an mx-axis and a cx-axis, and the mx-axis is tilted with reference to the m-axis in the direction of the c-axis by an off-angle α3 and the cx-axis is tilted with reference to the c-axis in the direction of the m-axis by an off-angle α3. The GaN wafer 5b has first markers 7b, each of which extends along the a-c reference plane in the same manner as the marker structures 3b.

In this embodiment, like the first embodiment, a number of semiconductor layers are grown on the GaN wafer 5b to form a stack of semiconductor layers on the GaN wafer 5b. The stack of semiconductor layers includes second markers, each of which extends along the a-axis. An insulating film is formed on the stack of semiconductor layers. This insulating film has openings, each of which extends in the same direction as that of the second markers. Electrodes are formed on the insulating film and the stack of semiconductor layers to complete a substrate product. This substrate product is cleaved into laser bars, each of which includes an arrangement of semiconductor devices. The laser bars are divided into nitride semiconductor laser devices by cutting. The substrate product is cleaved, for example, at the a-plane of the GaN crystal 2b.

In this embodiment, like the first embodiment, the alignment of a laser cavity can be carried out easily in the cleavage step. The off angle ranges preferably from 15 degrees to 70 degrees. In a range of an off-angle of 15 degrees or more, the primary surface of the GaN wafer 5b exhibits semipolar, and the stack of semiconductor layers are grown on the semipolar surface, resulting in production of nitride semiconductor lasers having a sufficiently reduced piezoelectric polarization. In a range of an off-angle of 70 degrees or less, a sufficiently large number of first markers 7b can be formed in the GaN wafer 5b.

In the GaN wafer 5b according to this embodiment, the distance between the second markers 7b is larger than the distance 3bt between two marker structures 3b.

Fourth Embodiment

Next, a method of fabricating a nitride semiconductor laser according to a fourth embodiment of the present invention will be described below. In this embodiment, crystal orientation of crystalline masses and a GaN wafer having a plurality of marker structures is different from that in the first embodiment.

Figure 10:
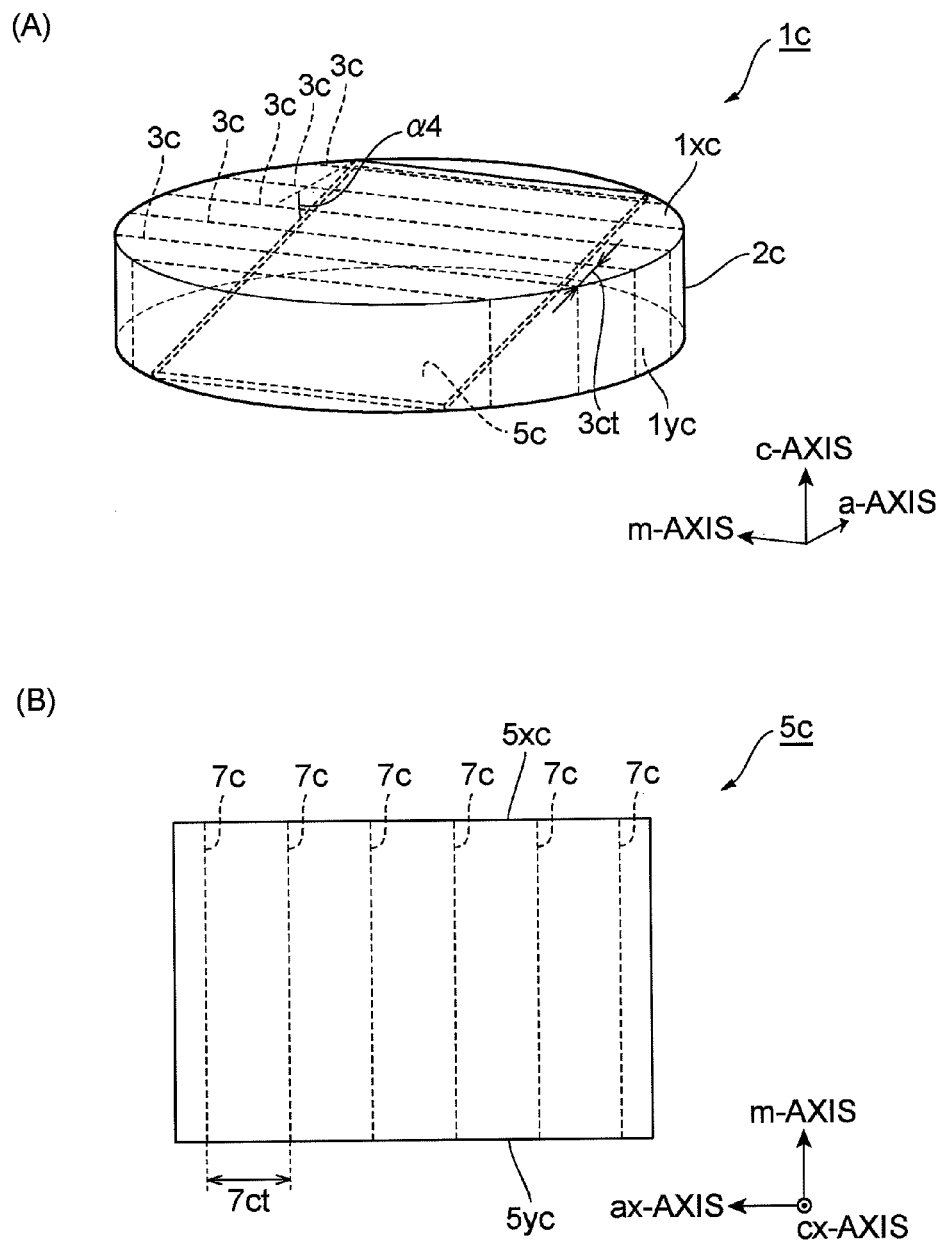
FIG. 10 is a schematic view illustrating a substrate and a GaN wafer according to a fourth embodiment of the present invention.

Part (A) of FIG. 10 is a schematic view showing a substrate 1c according to this embodiment. In the embodiment, marker structures 3c are included in the substrate 1c, and each of marker structures 3c extends along an m-c reference plane of a GaN crystal 2c.

In the embodiment, the substrate 1c is sliced into a GaN wafer 5c. In order to cut out the GaN wafer 5c, the substrate 1c is cut along a cutting plane that intersects with the marker structures 3c. This cutting plane is tilted with reference to the c-plane in the direction of the a-axis of the GaN crystal 2c by an off-angle α4.

Part (B) of FIG. 10 is a plan view showing the GaN wafer 5c thus cut out from the substrate 1c. The primary surface of the GaN wafer 5c is semipolar. Part (B) of FIG. 10 shows an ax-axis and a cx-axis. The ax-axis is tilted to the a-axis in the direction of the c-axis at the off angle α4, and the cx-axis is tilted to the c-axis in the direction of the a-axis by the off-angle α4. The GaN wafer 5c has first markers 7c, each of which extends along the m-c reference plane in the same manner as the marker structures 3c.

In this embodiment, like the first embodiment, a number of semiconductor layers is grown on the GaN wafer 5c to form a stack of semiconductor layers. Second markers are formed in the stack of semiconductor layers. An insulating film having openings is formed on the stack of semiconductor layers. The openings of the insulating film extend in the direction of the m-axis in which the second markers extend. Electrodes are formed on the stack of semiconductor layers and the insulating film to complete a substrate product. This substrate product is cleaved into laser bars at the m-plane that is a cleavage plane of the GaN crystal 2c. The laser bars are divided into individual nitride semiconductor laser devices.

In this embodiment, like the first embodiment, a laser cavity can be oriented easily. Besides, in this embodiment, the range of the off-angle can be equal to or more than 15 degrees, and can be equal to or less than 70 degrees as in the third embodiment.

In this embodiment, the distance 7ct between the adjacent second markers 7c is larger than the distance 3ct between adjacent marker structures 3c.

The present invention is not limited to the embodiments described above and can encompass other variations and modifications.

Figure 11:
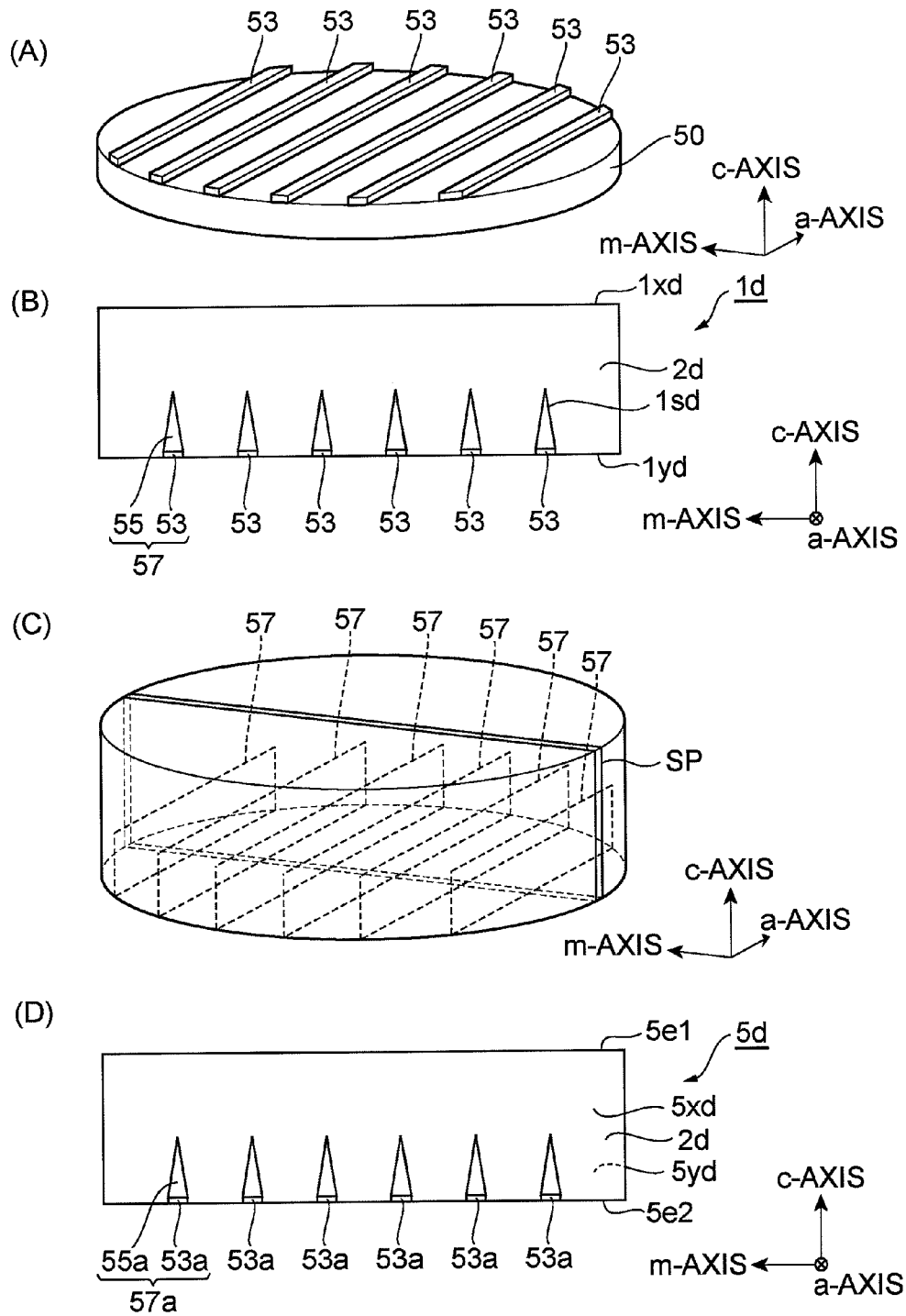
FIG. 11 is a schematic view illustrating a substrate fabricated by a method of forming a substrate, and a GaN wafer fabricated from the substrate.

For example, a substrate and a GaN wafer, which is cut out from the substrate, are not limited to the embodiments described above. Parts (A) and (B) of FIG. 11 show a modified embodiment of a substrate. As shown in Part (A) of FIG. 11, a mask layer 53 is formed on a substrate base 50. The mask layer 53 is composed of, for example, an insulating material, and the pattern of the mask layer 53 has a plurality of strips extending in the direction of the a-axis. The substrate base 50 allows a crystalline mass 2d of GaN to grow in the direction of the c-axis. After the mask layer 53 is formed on substrate base 50, the crystalline mass 2d is epitaxially grown on the substrate base 50 to form a composite, which is composed of the substrate base 50 and the crystalline mass 2d. The substrate base 50 is removed from the composite to form the substrate 1d, which is shown in Part (B) of FIG. 11. The substrate 1d includes marker structures 57 extending along the c-axis from the back surface 1yd. The marker structures 57 include groves 55 and the mask layers 53. Each grove 55 is defined by a plane 1sd extending in the direction from the back surface 1yd toward the primary surface 1xd of the substrate 1d. The marker structures 57 include the mask layers 53 having a striped pattern and made of material different from GaN. The material of the marker structures 57 can be a polycrystalline substance different from GaN, a metallic material, or an insulating material.

In this case, in order to cut out the GaN wafer 5d from the substrate 1d, for example, as shown in Part (C) of FIG. 11, the substrate 1d is sliced at a slicing plane SP, which extends along the a-plane of the crystalline mass 2d. This slicing plane SP intersects with the marker structures 3d. Part (D) of FIG. 11 is a plan view showing the GaN wafer 5d. The first markers 57a included in the GaN wafer 5d extend in the direction of the c-axis of the GaN wafer 5d. The first markers 57a starts from one edge 5e2 on the primary surface 5xd of the GaN wafer 5d, and extends toward the other edge 5e1 on the primary surface 5xd of the GaN wafer 5d, but do not reach the other edge 5e1.

Having described and illustrated the principle of the invention in a preferred embodiment thereof, it is appreciated by those having skill in the art that the invention can be modified in arrangement and detail without departing from such principles. We therefore claim all modifications and variations coming within the spirit and scope of the following claims.

What is claimed is:

1. A method of fabricating a nitride semiconductor laser, comprising the steps of:
preparing a substrate, the substrate having a crystalline mass, a primary surface, a back surface and a plurality of marker structures, the crystalline mass being made of a hexagonal gallium nitride semiconductor, the primary surface and the back surface intersecting with a predetermined axis extending in the direction of a c-axis of the hexagonal gallium nitride semiconductor, the crystalline mass extending from the primary surface to the back surface of the substrate, each of the marker structures extending along a reference plane from the primary surface to the back surface of the substrate, and the reference plane being one of the following planes: a plane defined by the c-axis and an m-axis of the hexagonal gallium nitride semiconductor; a plane defined by the c-axis and an a-axis of the hexagonal gallium nitride semiconductor;
cutting the substrate along a cutting plane to form a hexagonal gallium nitride semiconductor wafer, the cutting plane intersecting with the plurality of the marker structures, the hexagonal gallium nitride semiconductor wafer having a primary surface, a back surface and a plurality of first markers, each of the first markers extending from the primary surface to the back surface of the hexagonal gallium nitride semiconductor wafer, each of the first markers comprising part of each of the marker structures, the primary surface of the hexagonal gallium nitride semiconductor wafer being one of semipolar and nonpolar;
growing a number of semiconductor layers to form a stack of semiconductor layers, the stack of semiconductor layers including a plurality of gallium nitride based semiconductor layers for a semiconductor laser, the stack of semiconductor layers having second markers, the second markers extending in the gallium nitride based semiconductor layers, the second markers being formed on the first markers, the plurality of gallium nitride based semiconductor layers being epitaxially grown on the primary surface of the hexagonal gallium nitride semiconductor wafer;
forming an insulating film on the stack of semiconductor layers, the insulating film having openings, and the openings extending in the direction of the second markers;
forming electrodes on the insulating film and the stack of semiconductor layers to form a substrate product, after the formation of the insulating film; and
cleaving the substrate product at a cleavage plane of the hexagonal gallium nitride semiconductor, after the formation of the electrodes.

2. The method according to claim 1,
wherein the reference plane for the marker structures is defined by the a-axis and the c-axis of the hexagonal gallium nitride semiconductor, and
wherein the cutting plane rotates a given angle about the predetermined axis with reference to an m-plane of the hexagonal gallium nitride semiconductor.

3. The method according to claim 2,
wherein the primary surface of the hexagonal gallium nitride semiconductor wafer is tilted with reference to the m-plane of the hexagonal gallium nitride semiconductor,
wherein the distance between the adjacent first markers is larger than that of the adjacent marker structures, and
wherein the cleavage plane of the substrate product is a c-plane of the hexagonal gallium nitride semiconductor.

4. The method according to claim 2,
wherein the cutting plane extends along an a-plane of the hexagonal gallium nitride semiconductor.

5. The method according to claim 2,
wherein the primary surface of the hexagonal gallium nitride semiconductor wafer has an a-plane of the hexagonal gallium nitride semiconductor, and
wherein the cleavage plane of the substrate product is a c-plane of the hexagonal gallium nitride semiconductor.

6. The method according to claim 1,
wherein the reference plane for the marker structures is defined by the m-axis and the c-axis of the hexagonal gallium nitride semiconductor, and
wherein the cutting plane rotates a given angle about the predetermined axis with reference to an a-plane of the hexagonal gallium nitride semiconductor.

7. The method according to claim 6,
wherein the primary surface of the hexagonal gallium nitride semiconductor wafer is tilted with reference to the a-plane of the hexagonal gallium nitride semiconductor,
wherein a distance between the adjacent first markers is larger than that of the adjacent marker structures, and
wherein the cleavage plane of the substrate product is a c-plane of the hexagonal gallium nitride semiconductor.

8. The method according to claim 6,
wherein the cutting plane extends along an m-plane of the hexagonal gallium nitride semiconductor.

9. The method according to claim 6,
wherein the primary surface of the hexagonal gallium nitride semiconductor wafer has an m-plane of the hexagonal gallium nitride semiconductor, and
wherein the cleavage plane of the substrate product is a c-plane of the hexagonal gallium nitride semiconductor.

10. The method according to claim 1,
wherein the substrate has a side surface extending in the direction of the c-axis of the hexagonal gallium nitride semiconductor, and
wherein the cutting plane intersects with the primary surface, the back surface and the side surface of the substrate.

11. The method according to claim 1,
wherein the reference plane for the marker structures is defined by the a-axis and the c-axis of the hexagonal gallium nitride semiconductor, and
wherein the cutting plane is tilted by a given angle to the m-axis of the hexagonal gallium nitride semiconductor with reference to a c-plane of the hexagonal gallium nitride semiconductor.

12. The method according to claim 1,
wherein the primary surface of the hexagonal gallium nitride semiconductor wafer includes a semipolar surface, and the semipolar surface is tilted with reference to a c-plane of the hexagonal gallium nitride semiconductor,
wherein a distance between the adjacent first markers is larger than that of the adjacent marker structures, and
wherein the cleavage plane of the substrate product is an a-plane of the hexagonal gallium nitride semiconductor.

13. The method according to claim 1,
wherein the reference plane for the marker structures is defined by the m-axis and the c-axis of the hexagonal gallium nitride semiconductor, and
wherein the cutting plane is tilted by a given angle to the a-axis of the hexagonal gallium nitride semiconductor with reference to a c-plane of the hexagonal gallium nitride semiconductor.

14. The method according to claim 1,
wherein the primary surface of the hexagonal gallium nitride semiconductor wafer includes a semipolar surface, and the semipolar surface is tilted with reference to a c-plane of the hexagonal gallium nitride semiconductor,
wherein a distance between the adjacent first markers is larger than that of the adjacent marker structures, and
wherein the cleavage plane of the substrate product is an m-plane of the hexagonal gallium nitride semiconductor.

15. The method according to claim 11, wherein the given angle ranges from 15 degrees to 70 degrees.

16. The method according to claim 13, wherein the given angle ranges from 15 degrees to 70 degrees.

17. The method according to claim 1,
wherein the substrate has a side surface extending along the c-axis of the hexagonal gallium nitride semiconductor, and
wherein the cutting plane intersects with the side surface of the substrate.

18. The method according to claim 1,
wherein the marker structures comprises a hexagonal gallium nitride semiconductor,
wherein the substrate includes first regions and second regions arranged alternately,
wherein the crystal axis of the first regions is opposite to that of the second regions, and
wherein the plurality of marker structures includes the plurality of first regions, respectively.

19. The method according to claim 1,
wherein the marker structures comprises a hexagonal gallium nitride semiconductor,
wherein the substrate includes first regions and second regions arranged alternately,
wherein each first region has a first average threading dislocation density, and the first average threading dislocation density is greater than a predetermined threading dislocation density,
wherein each second region has a second average threading dislocation density, and the second average threading dislocation density is smaller than the predetermined threading dislocation density,
wherein the first regions and the second regions extend from the primary surface to the back surface of the substrate, and
wherein the plurality of marker structures include the plurality of first regions, respectively.

20. The method according to claim 1,
wherein the substrate has a plurality of grooves, and each groove includes a side surface extending from the primary surface to the back surface of the substrate, and
wherein the plurality of marker structures include the plurality of grooves, respectively.

21. The method according to claim 1,
wherein the side surface of the substrate has grooves, and the grooves extend from the primary surface to the back surface of the substrate,
wherein each marker structure includes a member comprising a material different from the hexagonal gallium nitride semiconductor,
wherein the member is provided in each groove and extends from the primary surface to the back surface of the substrate, and
wherein the member comprises one of a polycrystalline substance, metallic material and insulating material, and the polycrystalline substance is different from hexagonal gallium nitride single crystal.

* * * * *